(12) United States Patent
Kim

(10) Patent No.: US 10,825,795 B2
(45) Date of Patent: Nov. 3, 2020

(54) METHOD OF MANUFACTURING SEMICONDUCTOR DEVICES

(71) Applicant: Samsung Electronics Co., Ltd., Suwon-si (KR)

(72) Inventor: Yeong-Seok Kim, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/427,162

(22) Filed: May 30, 2019

(65) Prior Publication Data

US 2020/0144222 A1    May 7, 2020

(30) Foreign Application Priority Data

Nov. 6, 2018    (KR) .................. 10-2018-0135345

(51) Int. Cl.
| | |
|---|---|
| *H01L 21/00* | (2006.01) |
| *H01L 23/00* | (2006.01) |
| *H05K 3/32* | (2006.01) |
| *C09J 5/06* | (2006.01) |
| *H01L 21/50* | (2006.01) |
| *H01L 21/603* | (2006.01) |
| *H01L 21/60* | (2006.01) |

(52) U.S. Cl.
CPC ............... *H01L 24/95* (2013.01); *C09J 5/06* (2013.01); *H01L 21/50* (2013.01); *H05K 3/323* (2013.01); *H01L 2021/603* (2013.01); *H01L 2021/60277* (2013.01)

(58) Field of Classification Search
CPC ..... H01L 21/50; H01L 21/6835; H01L 21/78; H01L 21/565; H01L 24/95; H01L 24/83; H01L 24/19; H01L 24/73; H01L 24/32; H01L 24/97; H01L 2021/60277; H01L 2021/60; H05K 3/323; H05K 3/007; H05K 3/386; H05K 3/321; H05K 3/32
See application file for complete search history.

(56) References Cited

U.S. PATENT DOCUMENTS

| | | | |
|---|---|---|---|
| 4,954,197 A | 9/1990 | Jedlicka et al. | |
| 5,783,465 A * | 7/1998 | Canning | ................. H05K 3/323 257/E21.508 |
| 6,489,013 B2 * | 12/2002 | Nagai | ..................... C08L 79/08 428/209 |
| 6,873,059 B2 * | 3/2005 | Amagai | .............. H01L 21/6836 257/782 |
| 7,204,574 B2 | 4/2007 | Bertelsen et al. | |

(Continued)

FOREIGN PATENT DOCUMENTS

| | | |
|---|---|---|
| JP | 1999-0087413 A | 3/1999 |
| KR | 10-2014-0072325 A | 6/2014 |

*Primary Examiner* — Nikolay K Yushin
(74) *Attorney, Agent, or Firm* — Muir Patent Law, PLLC

(57) ABSTRACT

A method of manufacturing a semiconductor device may include forming an adhesive film on a surface of a semiconductor chip, mounting the semiconductor chip on a substrate such that the adhesive film contacts an upper surface of the substrate, and bonding the semiconductor chip and the substrate curing the adhesive film by simultaneously performing a thermo-compression process and an ultraviolet irradiation process on the adhesive film disposed between the substrate and the semiconductor chip.

20 Claims, 16 Drawing Sheets

(56) References Cited

U.S. PATENT DOCUMENTS

| | | | |
|---|---|---|---|
| 7,258,918 B2* | 8/2007 | Tsukagoshi | B32B 7/12 |
| | | | 428/355 AC |
| 7,394,163 B2 | 7/2008 | Baba et al. | |
| 7,731,884 B2 | 6/2010 | Kanpp et al. | |
| 8,499,810 B2 | 8/2013 | Schaper | |
| 9,039,401 B2 | 5/2015 | Slafer | |
| 9,085,717 B2* | 7/2015 | Youn | C09J 9/02 |
| 9,224,597 B2 | 12/2015 | Zhao et al. | |
| 9,365,749 B2* | 6/2016 | Khanna | C09J 9/02 |
| 10,344,211 B2* | 7/2019 | Taniguchi | G02F 1/13 |
| 2001/0018986 A1* | 9/2001 | Nagai | C08L 79/08 |
| | | | 174/259 |
| 2003/0178138 A1* | 9/2003 | Tsukagoshi | B32B 7/12 |
| | | | 156/326 |
| 2007/0188552 A1 | 8/2007 | Bertelsen et al. | |
| 2009/0039291 A1 | 2/2009 | Furuta et al. | |
| 2011/0207253 A1 | 8/2011 | Yang | |
| 2014/0153208 A1* | 6/2014 | Youn | C09J 9/02 |
| | | | 361/767 |
| 2014/0353540 A1* | 12/2014 | Khanna | C09J 9/02 |
| | | | 252/62.55 |
| 2016/0214285 A1 | 7/2016 | Taguchi et al. | |
| 2017/0355906 A1* | 12/2017 | Taniguchi | C09K 19/12 |

* cited by examiner

SECOND
DIRECTION ⊗ → FIRST DIRECTION

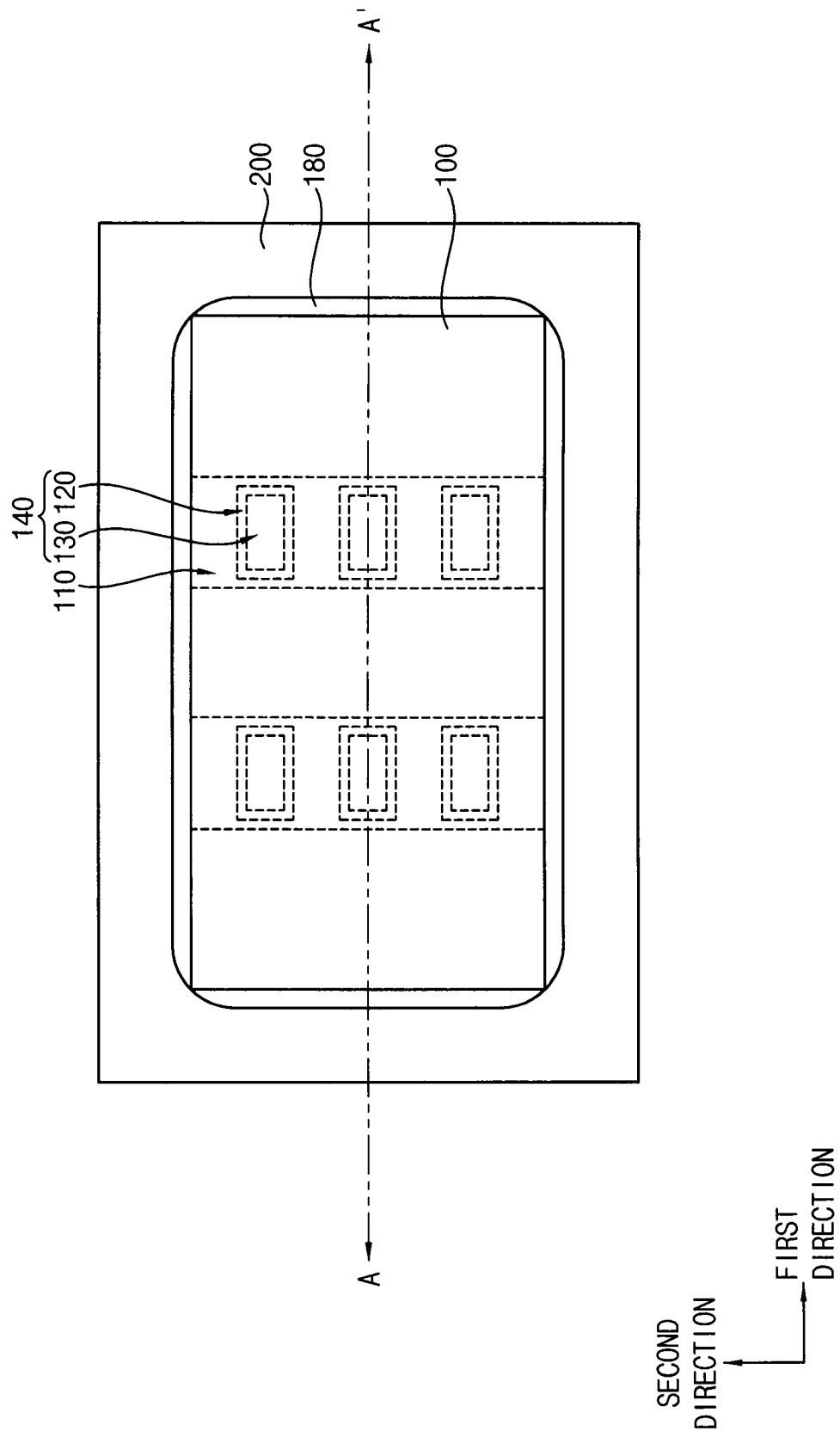

METHOD OF MANUFACTURING SEMICONDUCTOR DEVICES

CROSS-REFERENCE TO RELATED APPLICATION

This application claims priority under 35 USC § 119 to Korean Patent Application No. 10-2018-0135345, filed on Nov. 6, 2018 in the Korean Intellectual Property Office (KIPO), the contents of which are herein incorporated by reference in their entirety.

BACKGROUND

1. Field

Example embodiments relate to an adhesion method of semiconductor chips. More particularly, example embodiments relate to an adhesion method of semiconductor chips using an adhesive material.

2. Description of the Related Art

In a method of manufacturing a semiconductor package, an adhesive material may be used for bonding a semiconductor chip and a substrate. The adhesive material may be in a form of a non-conductive paste (NCP) or a non-conductive film (NCF) including a thermosetting resin.

The adhesive material may be cured by a thermo-compression process to form a cured film, however, the cured film may not entirely cover the semiconductor chip or may protrude from the semiconductor chip by the thermos-compression process, and in this case, the reliability of the semiconductor package may be deteriorated.

SUMMARY

Example embodiments provide a method of manufacturing a semiconductor device/package to improve the reliability of the semiconductor device/package.

According to example embodiments, there is provided a method of manufacturing a semiconductor device. The method may include forming an adhesive film on a surface of a semiconductor chip, mounting the semiconductor chip on a substrate such that the adhesive film contacts an upper surface of the substrate, and bonding the semiconductor chip and the substrate by curing the adhesive film by simultaneously performing a thermo-compression process and an ultraviolet irradiation process on the adhesive film disposed between the substrate and the semiconductor chip.

According to example embodiments, there is provided a method of manufacturing a semiconductor device. The method may include forming a connection structure on a surface of a semiconductor chip, forming an adhesive film on the semiconductor chip to cover the connection structure, mounting the semiconductor chip on a substrate such that the adhesive film contacts an upper surface of the substrate, and bonding the semiconductor chip and the substrate by curing the adhesive film by simultaneously performing a thermo-compression process and an ultraviolet irradiation process on the adhesive film positioned between the substrate and the semiconductor chip.

According to example embodiments, there is provided a method of manufacturing a semiconductor device. The method may include applying an adhesive paste on a substrate including a pad, mounting a semiconductor chip on the substrate on which the adhesive paste is applied, and bonding the semiconductor chip and the substrate by curing the adhesive paste by simultaneously performing a thermo-compression process and an ultraviolet irradiation process on the adhesive paste disposed between the substrate and the semiconductor chip.

A method of manufacturing a semiconductor device in accordance with example embodiments may include bonding a semiconductor chip to a substrate by simultaneously performing a thermo-compression process and a UV irradiation process on an adhesive material including a thermosetting resin and a photo-curable resin disposed between the semiconductor chip and the substrate on which the semiconductor chip is mounted. The thermo-compression process may be performed under high temperature and/or high pressure conditions in order to fill a space between the semiconductor chip and the substrate including all vertex portions of the semiconductor chip in a plan view, and adhesive material portions formed beyond sides of the semiconductor chip except the vertex portions in a plan view may be photo-cured by the UV irradiation process.

Accordingly, a cured film formed by curing the adhesive material may be formed to fill a gap between the semiconductor chip and the substrate corresponding to all the vertex portions of the semiconductor chip in a plan view, so that a void may not be formed. Also, the cured film may be minimized to be formed beyond the sides of the semiconductor chip in a plan view, e.g., an overflow of the adhesive material may be minimized. As a result, the reliability of the semiconductor package may be improved.

However, the invention is not limited to the above-described embodiments, and may be variously extended as some aspects are described below.

BRIEF DESCRIPTION OF THE DRAWINGS

FIGS. 12 to 18 are respectively plan views and cross-sectional views illustrating an adhesion method of semiconductor chips in accordance with example embodiments.

DETAILED DESCRIPTION OF EMBODIMENTS

An adhesion method of semiconductor chips in accordance with example embodiments will be described more fully hereinafter with reference to the accompanying drawings.

Figure 1:
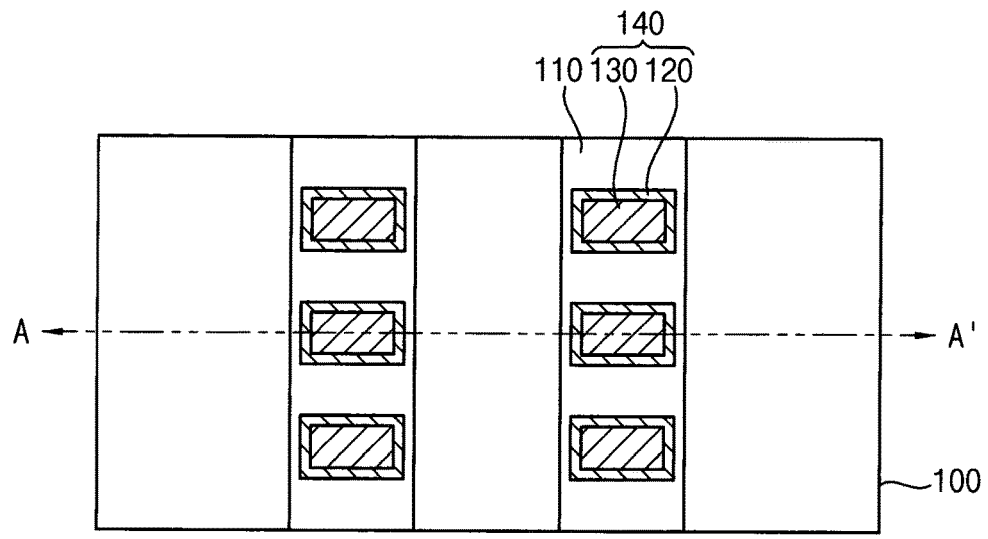
FIGS. 1 to 11 are respectively plan views, cross-sectional views and a perspective view illustrating an adhesion method of semiconductor chips in accordance with example embodiments.
Figure 2:
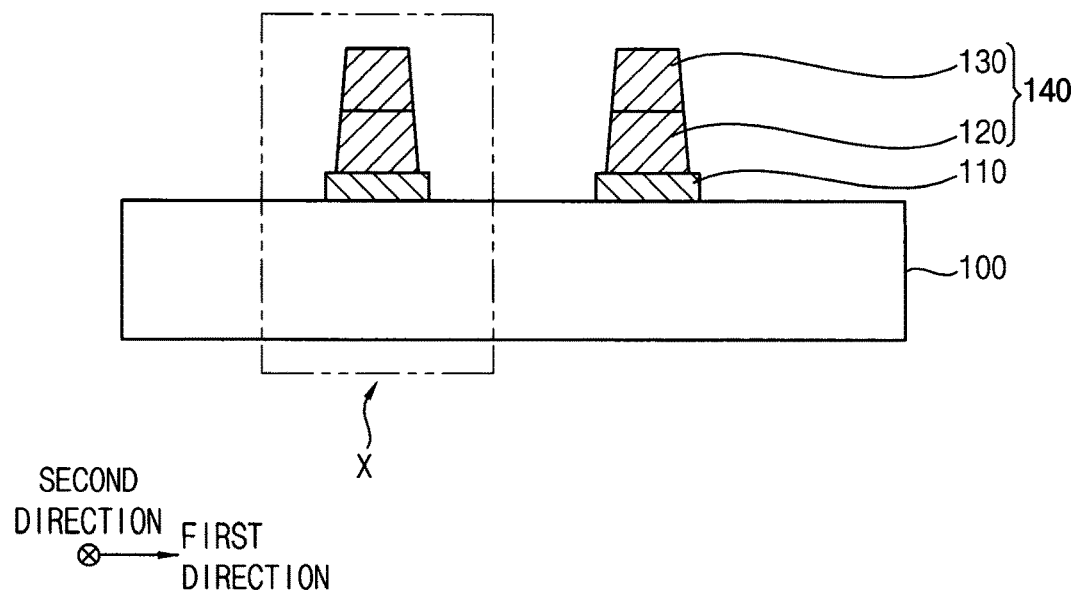
Figure 3:
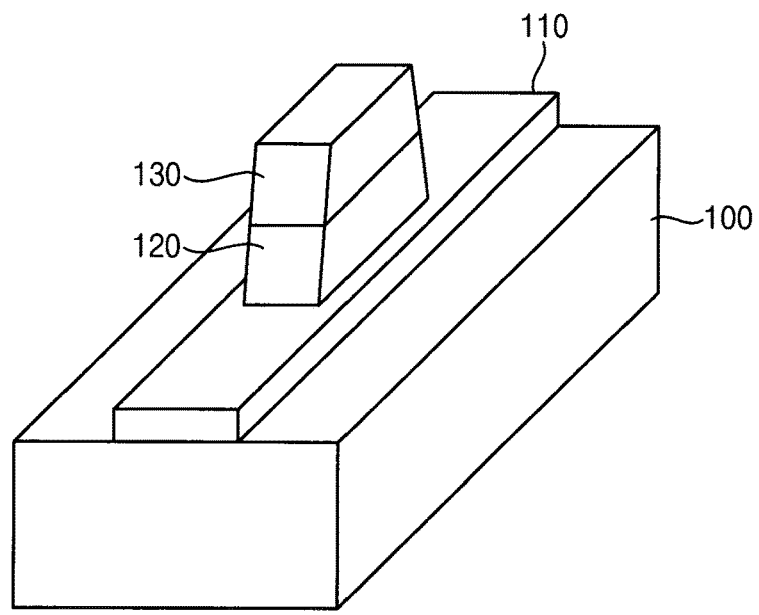

FIGS. 1 to 11 are respectively plan views, cross-sectional views and a perspective view illustrating an adhesion method of semiconductor chips in accordance with example embodiments. Specifically, FIGS. 1, 7-8 and 10-11 are the plan views, FIGS. 2, 4-6 and 9 are cross-sectional views taken along lines A-A' of corresponding plan views, respectively, and FIG. 3 is an enlarged perspective view of a region X of FIG. 2.

Referring to FIGS. 1 to 3, a conductive bump structure 140 including a first conductive bump 120 and a second conductive bump 130 sequentially stacked may be formed on a semiconductor chip 100 including a chip pad 110. For example, the first conductive bump 120 and the second conductive bump 130 may be sequentially stacked on the chip pad 110.

For example, after forming a seed layer (not shown) on the chip pad 110 of the semiconductor chip 100, a plating process may be performed on the seed layer to form first and second conductive bump layers, and the first and second conductive bump layers may be patterned to form the first and second conductive bumps 120 and 130. The first and second conductive bumps 120 and 130 may be sequentially stacked. For example, the first and second conductive bump layers may be sequentially patterned by two different by two different patterning process, or may be patterned integrally by a patterning process. The chip pad 110 and the conductive bump structure 140 altogether may form a connection structure.

In one embodiment, the semiconductor chip 100 may include a semiconductor element, e.g., a transistor, a contact plug, a wiring, a capacitor, etc.

FIG. 1 illustrates that the semiconductor chip 100 has a rectangular shape in a plan view, however, the inventive concept may not be limited thereto, and the semiconductor chip 100 may have a square shape or another polygonal shape, e.g., a triangular shape, a pentagon shape, etc.

A plurality of chip pads 110 may be formed along a first direction substantially parallel to an upper surface of the semiconductor chip 100, and each of the chip pads 110 may extend in a second direction substantially parallel to the upper surface of the semiconductor chip and intersecting with the first direction. In example embodiments, the first and second directions may be substantially orthogonal to each other.

A plurality of conductive bump structures 140 may be formed along the second direction on the chip pad 110. Accordingly, the conductive bump structures 140 may be electrically connected to the chip pad 110.

In example embodiments, a sidewall of the conductive bump structure 140 in the second direction may have an inclined slope and may not perpendicular to the upper surface of the semiconductor chip 100, and thus an upper surface of the second conductive bump 130 may have a width in the second direction less than that of a lower surface of the first conductive bump 120. For example, when viewed in the first direction, the conductive bump structure 140 may have a trapezoidal shape. However, the inventive concept is not limited thereto, and the upper surface of the second conductive bump 130 may have a width in the second direction greater than that of the lower surface of the first conductive bump 120. For example, when viewed in the first direction, the conductive bump structure 140 may have an inverted trapezoidal shape.

In certain embodiments, the sidewall of the conductive bump structure 140 in the second direction may be perpendicular to the upper surface of the semiconductor chip 100, and thus the upper surface of the second conductive bump 130 and the lower surface of the first conductive bump 120 may have the same width in the second direction. For example, when viewed in the first direction, the conductive bump structure 140 may have a rectangular shape.

FIG. 3 illustrates that the first and second conductive bumps 120 and 130 have the same width in the first direction as each other, however, the inventive concept is not limited thereto. For example, the width of the second conductive bump 130 in the first direction may increase from an upper portion toward a lower portion thereof, and the width of the first conductive bump 120 in the first direction may increase from a lower portion toward an upper portion thereof. Accordingly, when viewed from the second direction, the conductive bump structure 140 may have an elliptical shape. For example, the width of the upper surface of the first bump 120 may be the same as the width of the lower surface of the second bump 130 in the first direction, the width of the lower surface of the first bump 120 may be less than the width of the upper surface of the first bump 120 in the first direction, and the width of the upper surface of the second bump 130 may be less than the width of the lower surface of the second bump 130 in the first direction. For example, respective side views of the first and second conductive bumps 120 and 130 from the second direction may be trapezoids, e.g., isosceles trapezoid.

In example embodiments, the chip pad 110 may include polysilicon, the first conductive bump 120 may include a first conductive material, e.g., copper (Cu), nickel (Ni), etc., and the second conductive bump 130 may include a second conductive material, e.g., tin (Sn), tin/silver (Sn/Ag), tin/copper (Sn/Cu), tin/indium (Sn/In), etc. However, the first and second conductive materials are not limited thereto.

Figure 4:
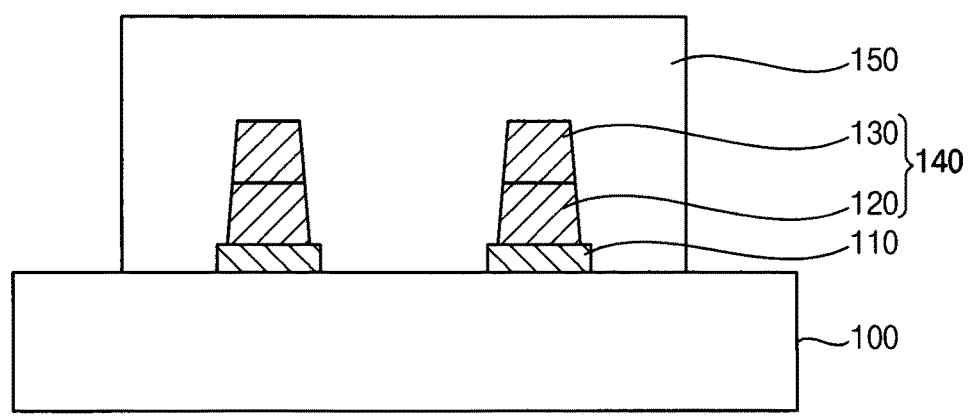

Referring to FIG. 4, an adhesive film 150 may be formed on the upper surface of the semiconductor chip 100 to cover the connection structure including the chip pad 110 and the conductive bump structure 140. An upper surface of the adhesive film 150 may have a height higher than that of the upper surface of the second conductive bump 130.

In example embodiments, the adhesive film 150 may be formed by, e.g., a chemical vapor deposition (CVD) process, an atomic layer deposition (ALD) process, etc.

In example embodiments, the adhesive film 150 may include a binding resin, a thermosetting resin and a photo-curable resin. The binding resin may include, e.g., an acrylic resin or a phenoxy resin. The thermosetting resin may be formed by, e.g., a reaction between at least one selected from the group consisting of an epoxy resin, an acrylic resin and a silicon resin, and a thermosetting agent. The thermosetting agent may include, e.g., an amine hardener, an acid anhydride hardener, a polyol hardener, an azine hardener, a phenol hardener, etc. The photo-curable resin may be formed by, e.g., a reaction between an acrylic resin having carbon double bond and a photo-curing initiator, the acrylic resin having carbon double bond may include, e.g., 2-hydroxyethyl acrylate (HEA), 2-hydroxyethyl methacrylate (HEMA), 2,3-epoxypropyl methacrylate (EPMA), acrylic acid (AA), methacrylic acid (MAA), etc., and the photo-curing initiator may include, e.g., isodecyl acrylate (IDA), 2-penoxyethyl acrylate (PEA), hexanediol diacrylate (HDDA), tripropylene glycol diacrylate (TrPGDA), trimethylolpropane triacrylate (TMPTA), trimethylolpropane ethoxy triacrylate (TMPEOTA), etc.

In one embodiment, the adhesive film 150 may further include an inorganic filler, an organic filler, and/or a metal filler. The inorganic filler may include, e.g., silicon dioxide ($SiO_2$), aluminum oxide ($Al_2O_3$), titanium dioxide ($TiO_2$), aluminum nitride (AlN), silicon nitride ($Si_3N_4$), boron nitride (BN), etc., the organic filler may include, e.g., acrylic copolymer containing epoxy group with a molecular weight of about 100,000 or more, and the metal filler may include a metal, e.g., aluminum (Al), nickel (Ni), silver (Ag), etc. The inorganic filler, the organic filler and the metal filler may lower the thermal expansion coefficient of the adhesive film 150, so as to control a subsequent thermo-compression process to be performed stably, and thus the reliability of the semiconductor package may be improved.

Figure 5:
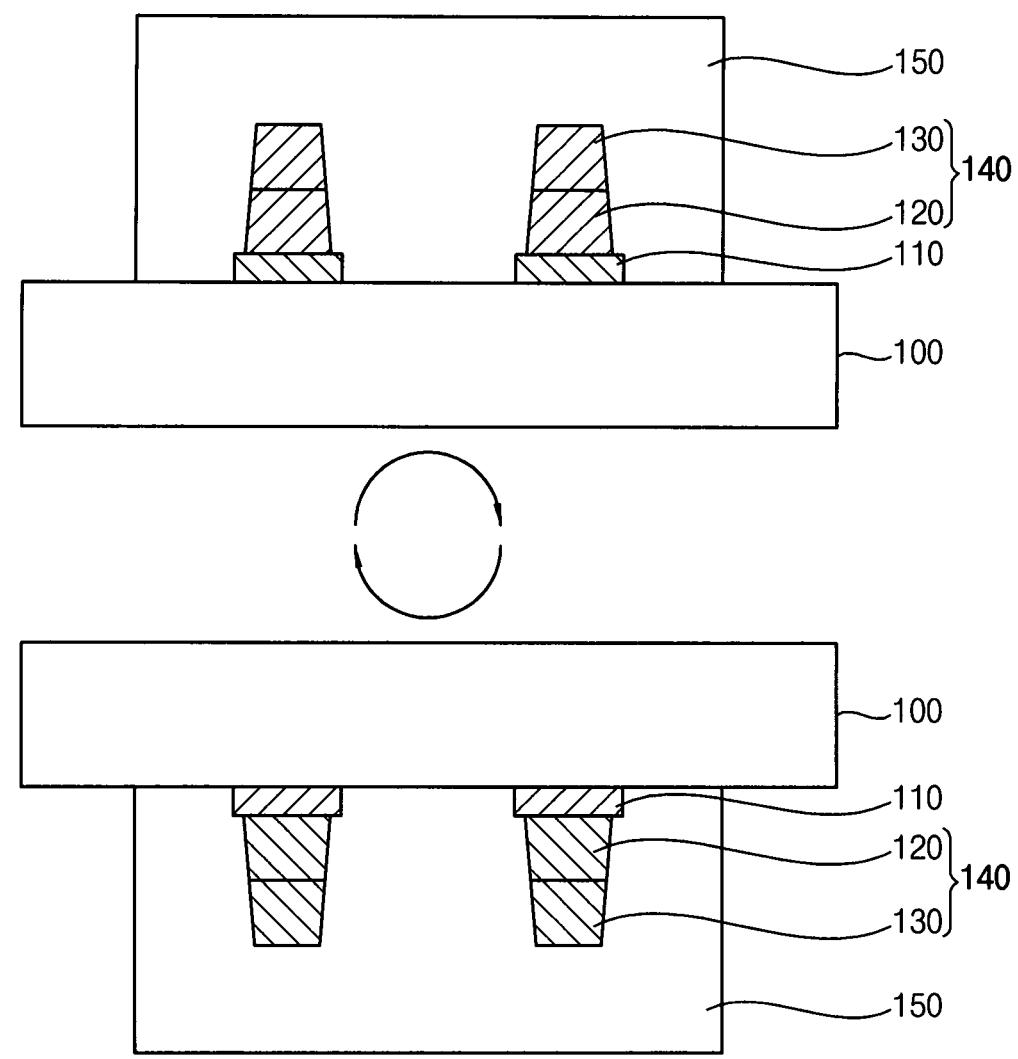

Referring to FIG. 5, the semiconductor chip 100 on which the adhesive film 150 is formed may be reversed upside down.

Accordingly, the adhesive film 150 covering the connection structure on the upper surface of the semiconductor chip 100 may be directed downward.

Figure 6:
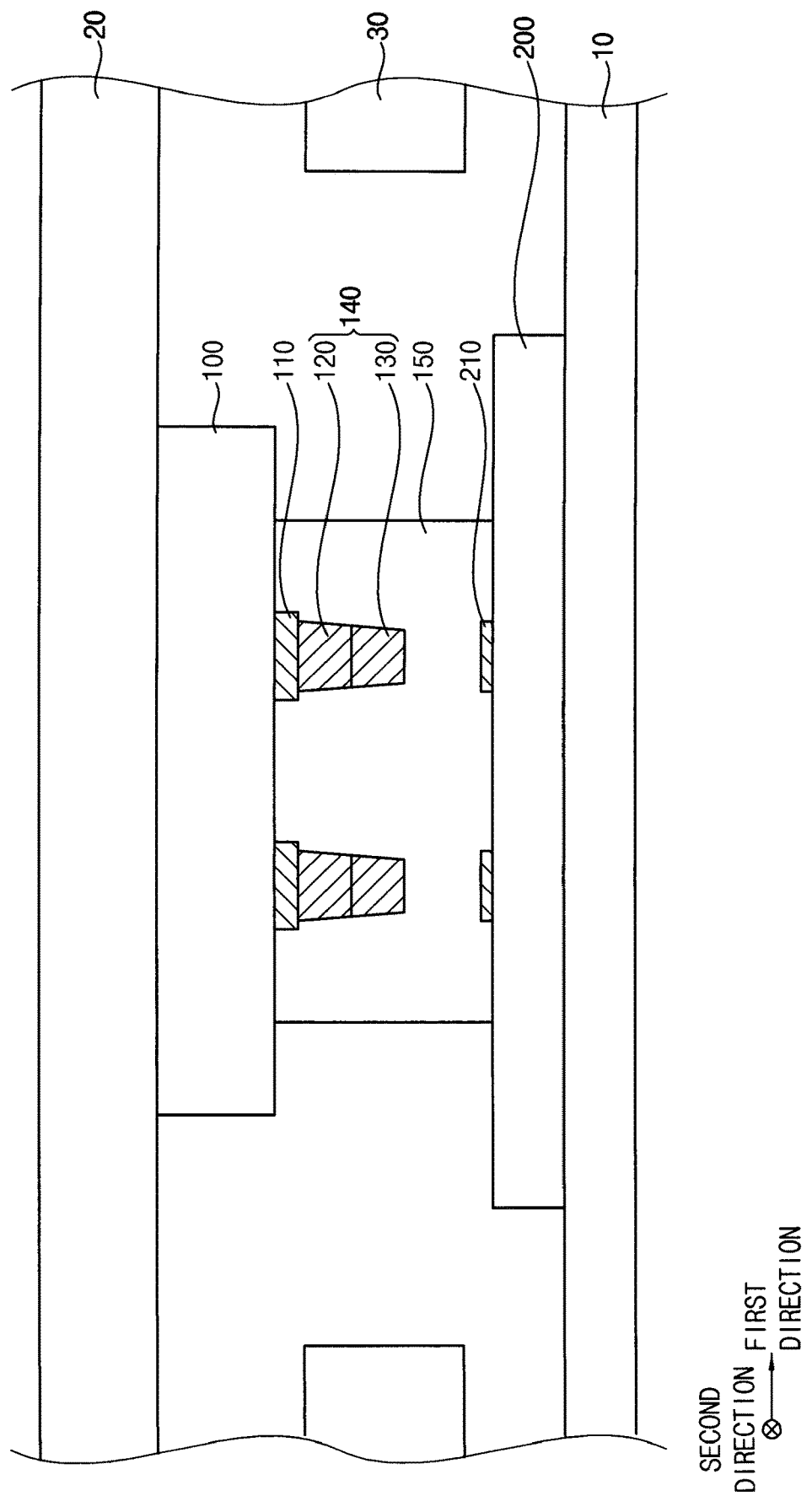

Referring to FIG. 6, the semiconductor chip 100 may be mounted on a substrate 200 including a substrate pad 210.

For example, the semiconductor chip 100 may be mounted on the substrate 200 such that the upper surface of the semiconductor chip 100 on which the adhesive film 150 covering the connection structure is formed may face an upper surface of the substrate 200, and the second conductive bump 130 of the connection structure and the substrate pad 210 of the substrate 200 may be aligned with each other. For example, the first and second conductive bumps 120 and 130 may overlap the substrate pad 210 in a plan view.

In one embodiment, the substrate 200 may be, e.g., a printed circuit board (PCB), and the PCB may be a multilayer circuit board having vias and various circuits therein. Otherwise, the substrate 200 may be, e.g., a silicon (Si) chip or a silicon (Si) wafer.

The substrate 200 may be disposed on a lower mold 10, an upper mold 20 may be disposed on the semiconductor chip 100, and an ultraviolet irradiator 30 may be disposed in a space between the lower and upper molds 10 and 20. The lower mold 10 may fix the substrate 200 so as not to move up and down, the upper mold 20 may downwardly compress the semiconductor chip 100 along a vertical direction substantially perpendicular to the upper surface of the substrate 200 when a subsequent thermo-compression process is performed. The ultraviolet irradiator 30 may irradiate the adhesive film 150 with ultraviolet rays when an ultraviolet irradiation process is performed.

FIGS. 4 to 6 illustrate that the adhesive film 150 is formed to cover/contact the connection structure on the semiconductor chip 100, however, the inventive concept is not limited thereto. For example, the adhesive film may be separately manufactured, and thus may not cover/contact the connection structure on the semiconductor chip 100. In this case, when the semiconductor chip 100 is mounted on the substrate 200, the adhesive film 150 may be provided in a space between the semiconductor chip 100 and the substrate 200, e.g., in a space between the connection structure and the substrate pad 210.

Referring to FIGS. 7 to 10, a thermo-compression process and an ultraviolet irradiation process may be simultaneously performed on the semiconductor chip 100, the adhesive film 150 and the substrate 200.

Accordingly, the adhesive film 150 disposed in the space between the semiconductor chip 100 and the substrate 200 may be compressed while heat is provided to the adhesive film 150, so that the connection structure of the semiconductor chip 100 may contact the substrate pad 210 of the substrate 200 to be electrically connected thereto, and the adhesive film 150 may be cured to form a first cured film 160 by the thermo-compression process and the ultraviolet irradiation process.

Figure 7:
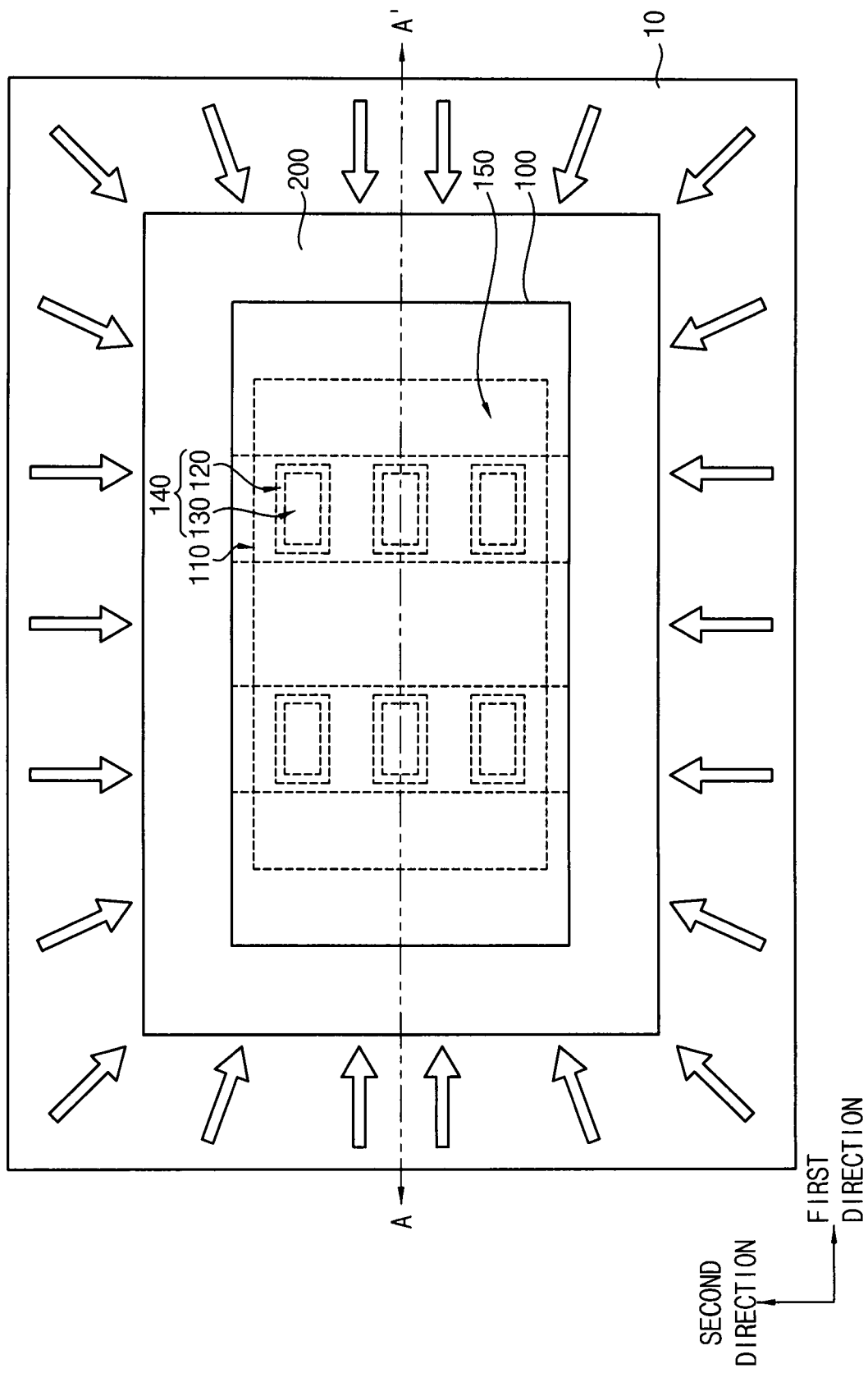

The thermo-compression process may be performed by downwardly moving the upper mold 20 to press the semiconductor chip 100 onto the substrate 200 disposed on the lower mold 10, and increasing the temperature of the space between the lower and upper molds 10 and 20. Specifically, heat is applied from an external source, such as by heating one or both of lower and upper molds 10 and 20, or by applying heat to the atmosphere between the lower and upper molds 10 and 20 from an external source which is then transferred to resin 150. As illustrated in FIG. 7, the thermo-compression process may be performed on a portion of the adhesive film 150 corresponding to all sides including vertex portions of a polygonal shape of the semiconductor chip 100.

Figure 8:
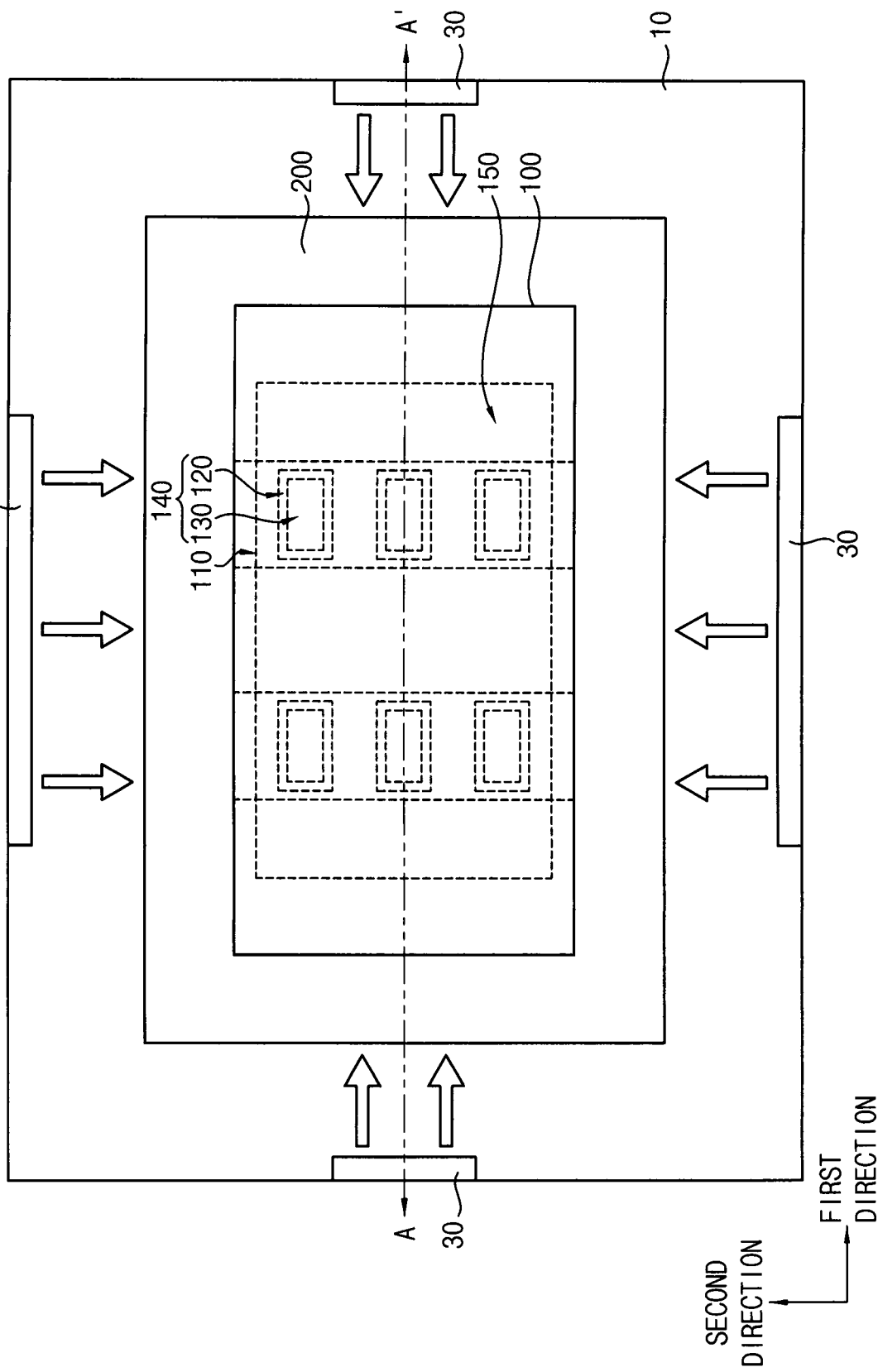

The ultraviolet irradiation process may be performed on the adhesive film 150 by irradiating ultraviolet rays generated from the ultraviolet irradiator 30 at an angle of about 0° to about 90° with respect to the upper surface of the substrate 200. As illustrated in FIG. 8, the ultraviolet irradiation process may be performed on portions of the adhesive film 150 corresponding to all sides except for the vertex portions of the polygonal shape of the semiconductor chip 100, or corresponding to at least one side of the polygonal shape of the semiconductor chip 100. For example, the ultraviolet irradiator 30 may irradiate the adhesive film 150 with ultraviolet light at one or more side portions of the polygonal shape of the semiconductor chip 100 in a plan view. For example, the ultraviolet irradiator 30 may not irradiate the adhesive film 150 with ultraviolet light at the corners, e.g., portions corresponding to the vertices and/or the vicinities of the vertices of the polygonal shape of the semiconductor chip 100 in the plan view. For example, the adhesive film 150 may not be cured by the ultraviolet light in the corners/vertex while the adhesive film 150 in the side areas is cured by the ultraviolet light. In one embodiment, the ultraviolet irradiation process may be performed along the first and second directions.

Accordingly, even if the adhesive film 150 fills spaces corresponding to the sides of the polygonal shape of the semiconductor chip 100 faster than spaces corresponding to the vertex portions thereof by the thermo-compression process, the adhesive film 150 may be cured by the ultraviolet light to minimize portions of the adhesive film 150 outwardly protruding from the sides of the semiconductor chip 100 by the ultraviolet irradiation process. During this photo curing process, the adhesive film 150 in the vertex portions (vertices and their vicinities) may not be cured by the ultraviolet light. This may also be helpful for the adhesive film 150 to expand/spread toward the vertex portions of the semiconductor chip 100. For example, the adhesive film 150 may expand/spread toward the sides and the vertices of the polygonal shape of the semiconductor chip 100 in a plan view while the thermo-compression process is performed, and expansion of the adhesive film 150 toward the sides may be controlled by the ultraviolet light irradiation. For example, the adhesive film 150 may include both of a thermosetting resin and a photo-curable resin, and thus the first cured film 160 may fill most of the spaces corresponding to the vertex portions of the polygonal shape of the semiconductor chip 100 by the thermo-compression process, and it may be beneficial to minimize protruding portions of the first cured film 160 outwardly protruding from the area/spaces corresponding to the sides of the polygonal shape of the semiconductor chip 100 by the ultraviolet irradiation process.

In example embodiments, the difference between a maximum width of a lower surface of the first cured film 160 and a maximum width of the lower surface of the semiconductor chip 100 may be less than or about 500 μm. For example, the difference between a width of the lower surface of the first cured film 160 in the first direction and a width of the lower surface of the semiconductor chip 100 in the first direction may be less than or about 500 μm, and the difference between a width of the lower surface of the first cured film 160 in the second direction and a width of the lower surface of the semiconductor chip 100 in the second direction may be also less than or about 500 μm.

In example embodiments, the thermo-compression process may be performed at a temperature of about 350° C. or less and a pressure of about 100 N/mm$^2$ or less, and the ultraviolet irradiation process may be performed at a light quantity of about 5,000 mJ/cm$^2$ or less.

Figure 9:
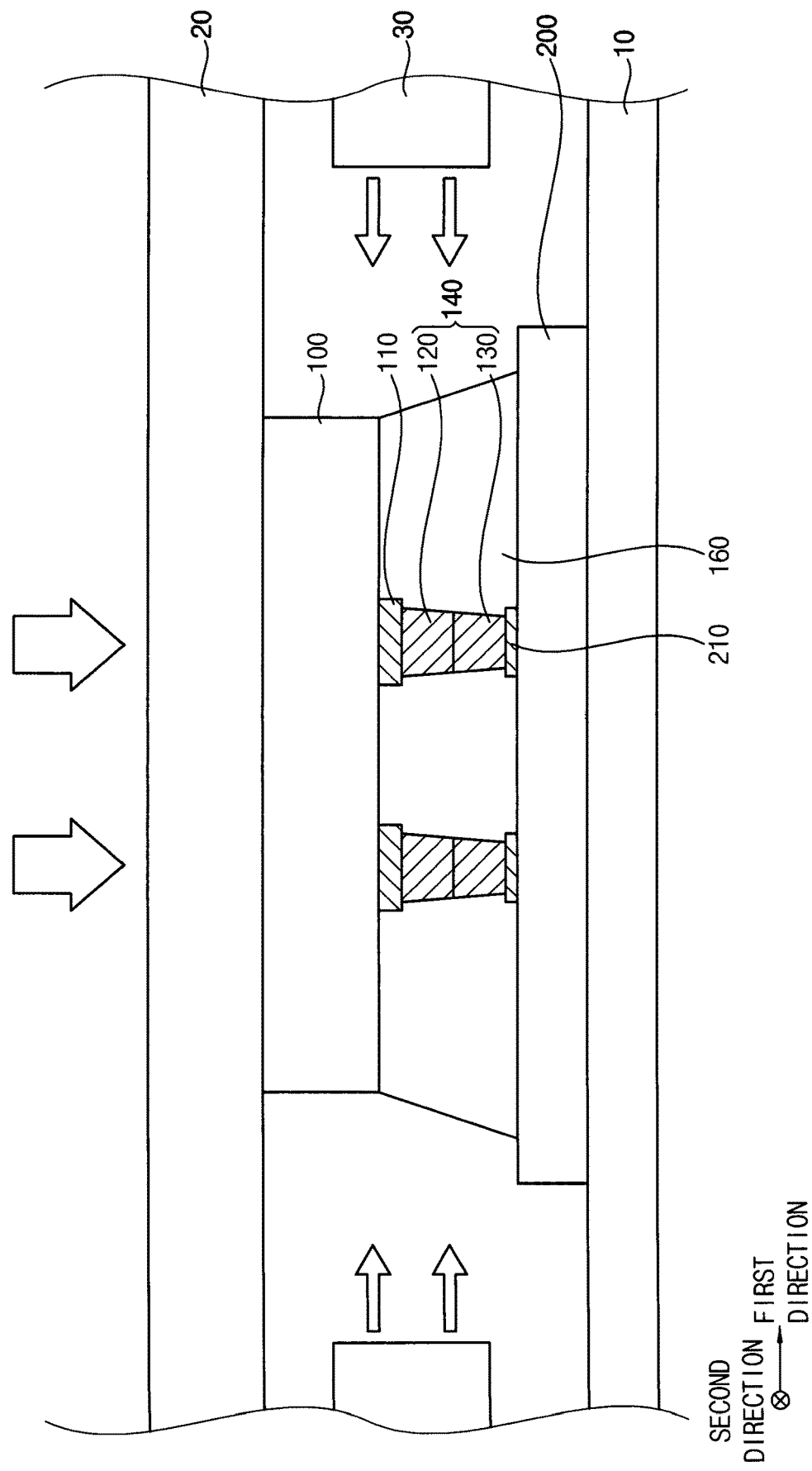
Figure 10:
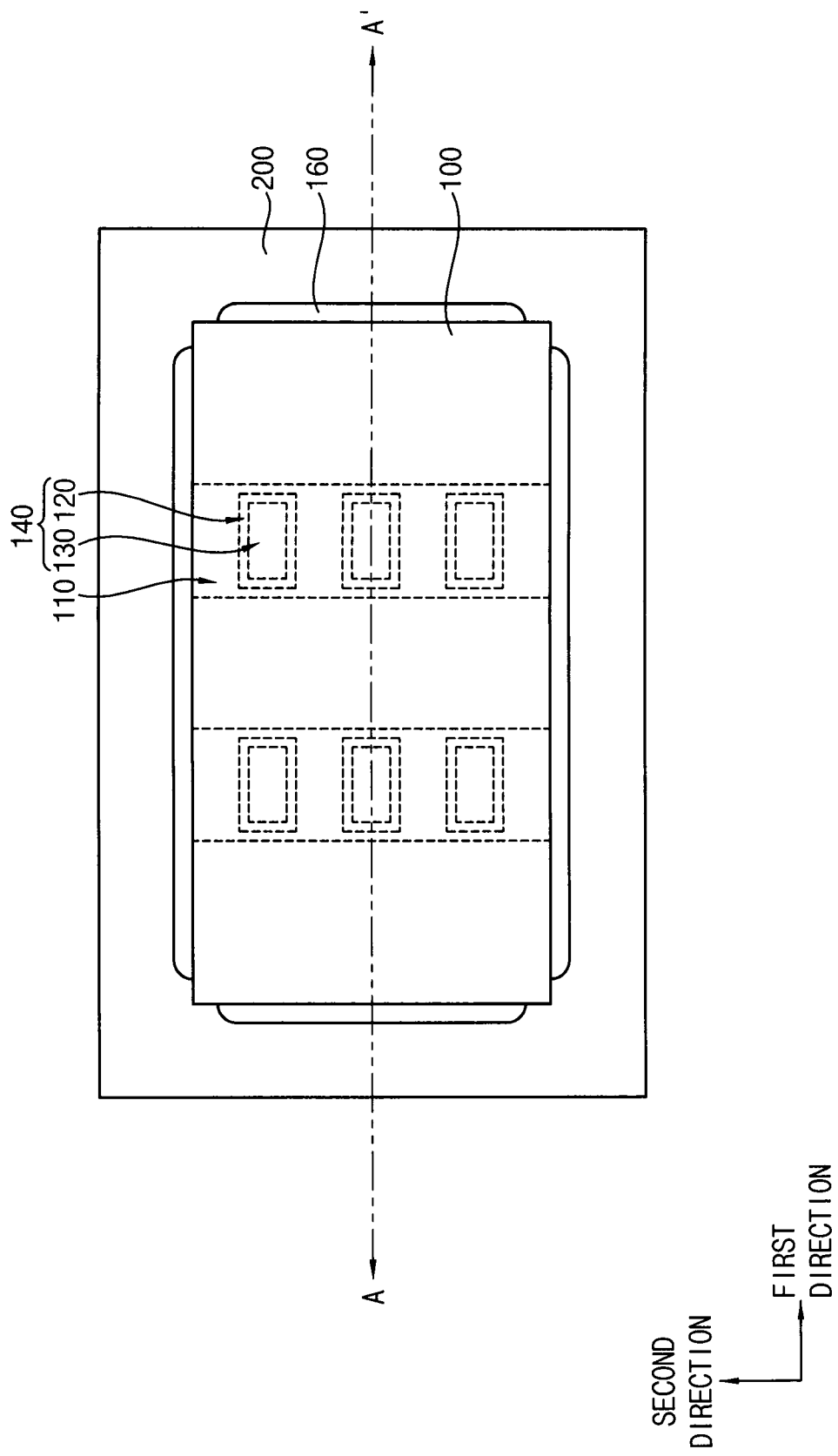

FIG. 9 illustrates that a sidewall of the first cured film 160 that is formed by curing the adhesive film 150 has a constant slope with respect to the upper surface of the substrate 200, however, the inventive concept is not limited thereto. For example, a sidewall of the first cured film 160 may have a non-constant slope with respect to the upper surface of the substrate 200, and for example, the first cured film 160 may also have a sidewall having an increasing slope or a decreasing slope with respect to the upper surface of the substrate 200. The adhesive film 150 may not fill all spaces between the substrate 200 and the semiconductor chip 100 as shown in FIG. 10. For example, in the vicinity of the vertices of the semiconductor chip 100 in a plan view, the adhesive film 150 and/or the first cured film 160 may not be filled between the semiconductor chip 100 and the substrate 200 after the thermo-compression process is completed as shown in FIG. 10. For example, the adhesive film 150 and/or the first cured film 160 may not protrude outwardly from the vertices portions of the semiconductor chip 100 in a plan view after the thermo-compression process is completed.

Figure 11:
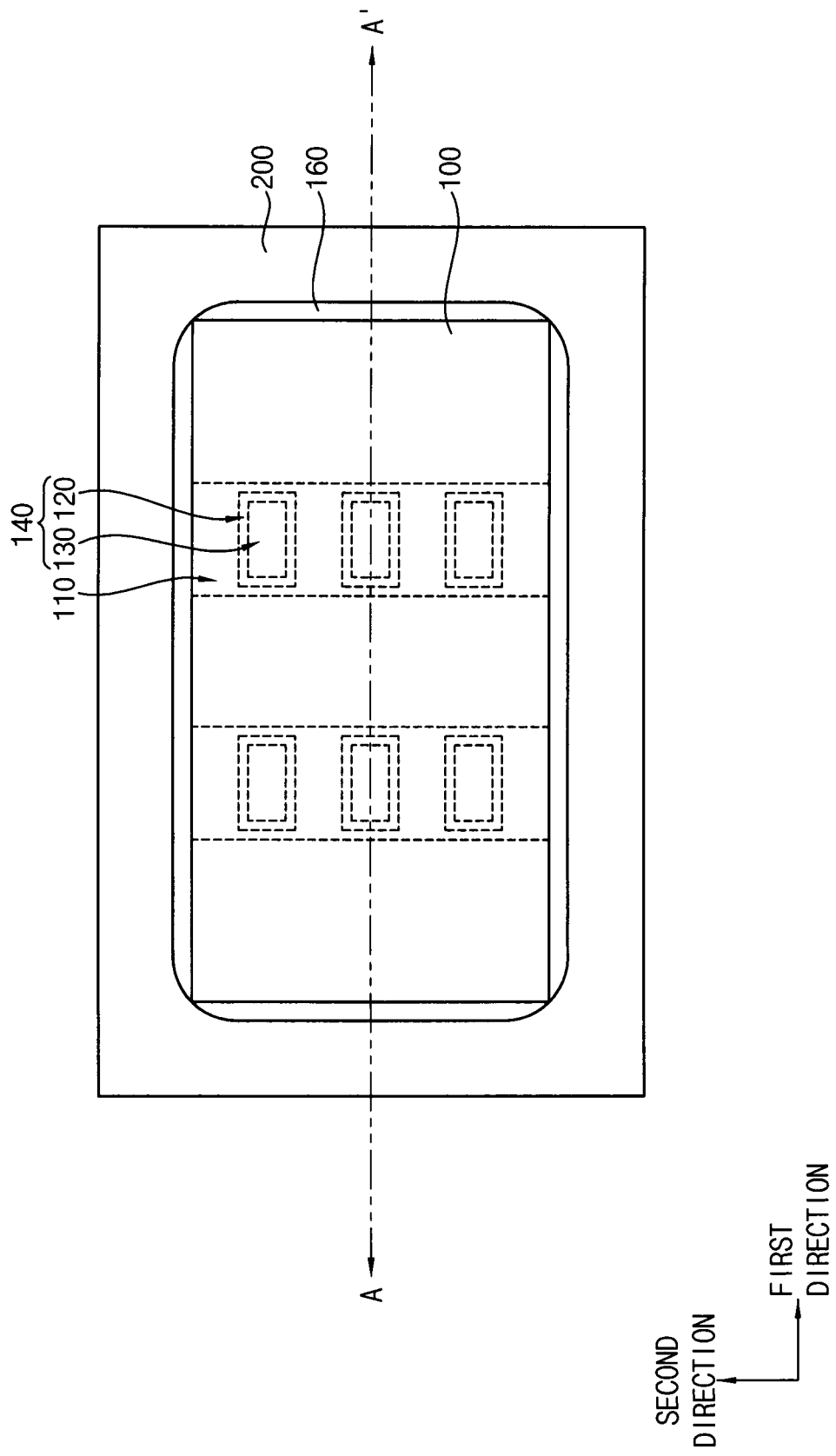

Referring to FIG. 11, the first cured film 160 may fill all spaces on the substrate 200 corresponding to the semiconductor chip 100, however, an area of the portions of the first cured film 160 outwardly protruding from the semiconductor chip 100 may be small. FIG. 11 illustrate an embodiment that the first cured film 160 is not protruding outwardly from the vertex portions of the semiconductor chip 100 in the plan view. However, the invention is not limited thereto. For example, the first cured film 160 may protrude outwardly from the vertex portions of the semiconductor chip 100 in certain embodiments.

As described above, when the thermo-compression process and the ultraviolet irradiation process are performed with respect to the adhesive film 150 between the semiconductor chip 100 and the substrate 200, the thermo-compression process may be performed on the portion of the adhesive film 150 corresponding to all sides including vertex portions of a polygonal shape of the semiconductor chip 100, however, the ultraviolet irradiation process may be performed only on the portion of the adhesive film 150 corresponding to all sides except for the vertex portions of the polygonal shape of the semiconductor chip 100.

Accordingly, the first cured film 160 formed by curing the adhesive film 150 may fill most of the spaces corresponding to the vertex portions of the polygonal shape of the semiconductor chip 100 by the thermo-compression process, and it is beneficial to minimize the portions of the first cured film 160 outwardly protruding from the spaces corresponding to the sides of the polygonal shape of the semiconductor chip 100. As a result, while the semiconductor chip 100 may be well bonded to the substrate 200, it is beneficial to minimize the first cured film 160 outwardly protruding from the semiconductor chip 100 due to the overflow of the adhesive film 150, so that the deterioration of the reliability of the semiconductor package may be reduced.

Figure 12:
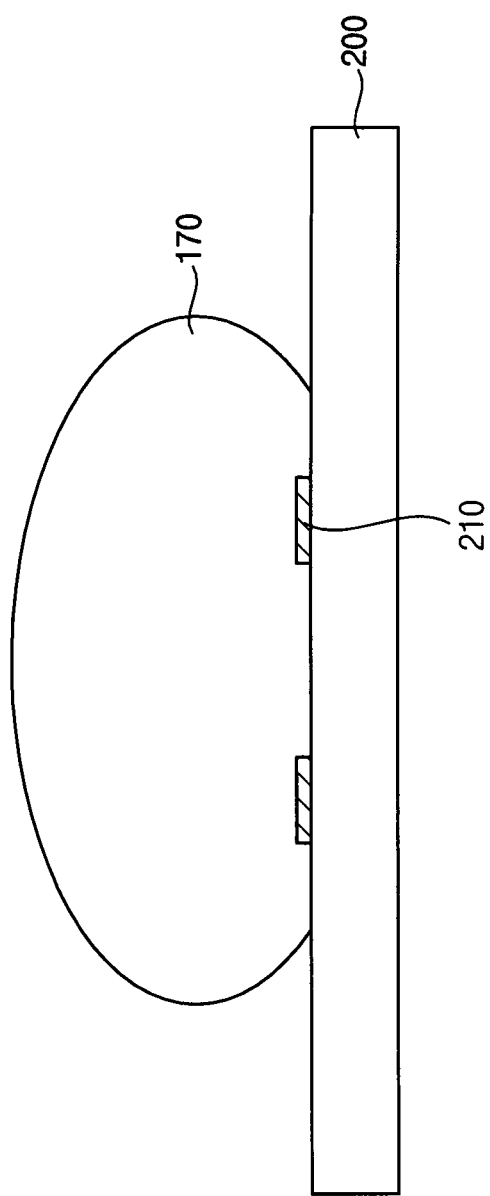
Figure 13:
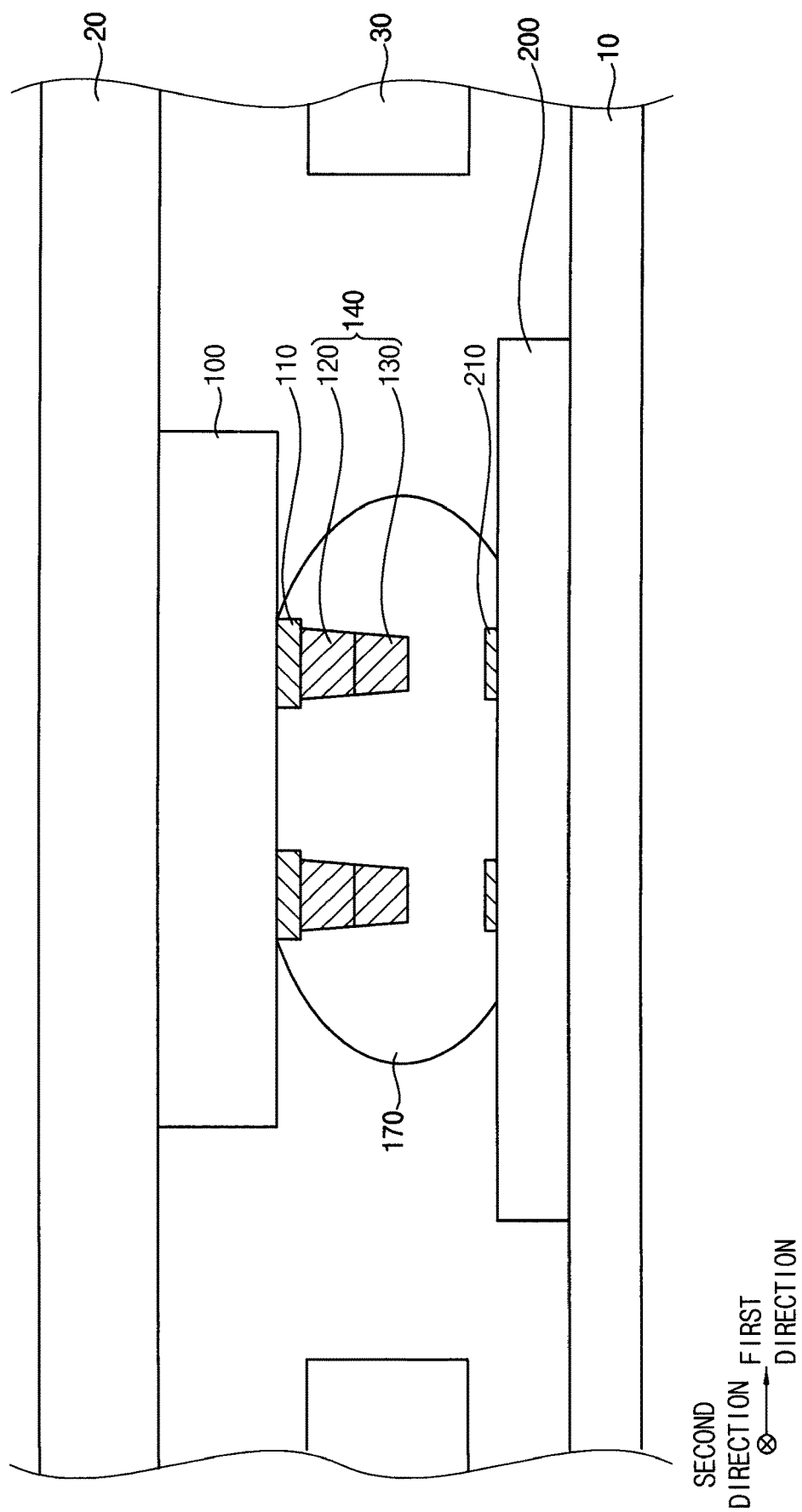
Figure 14:
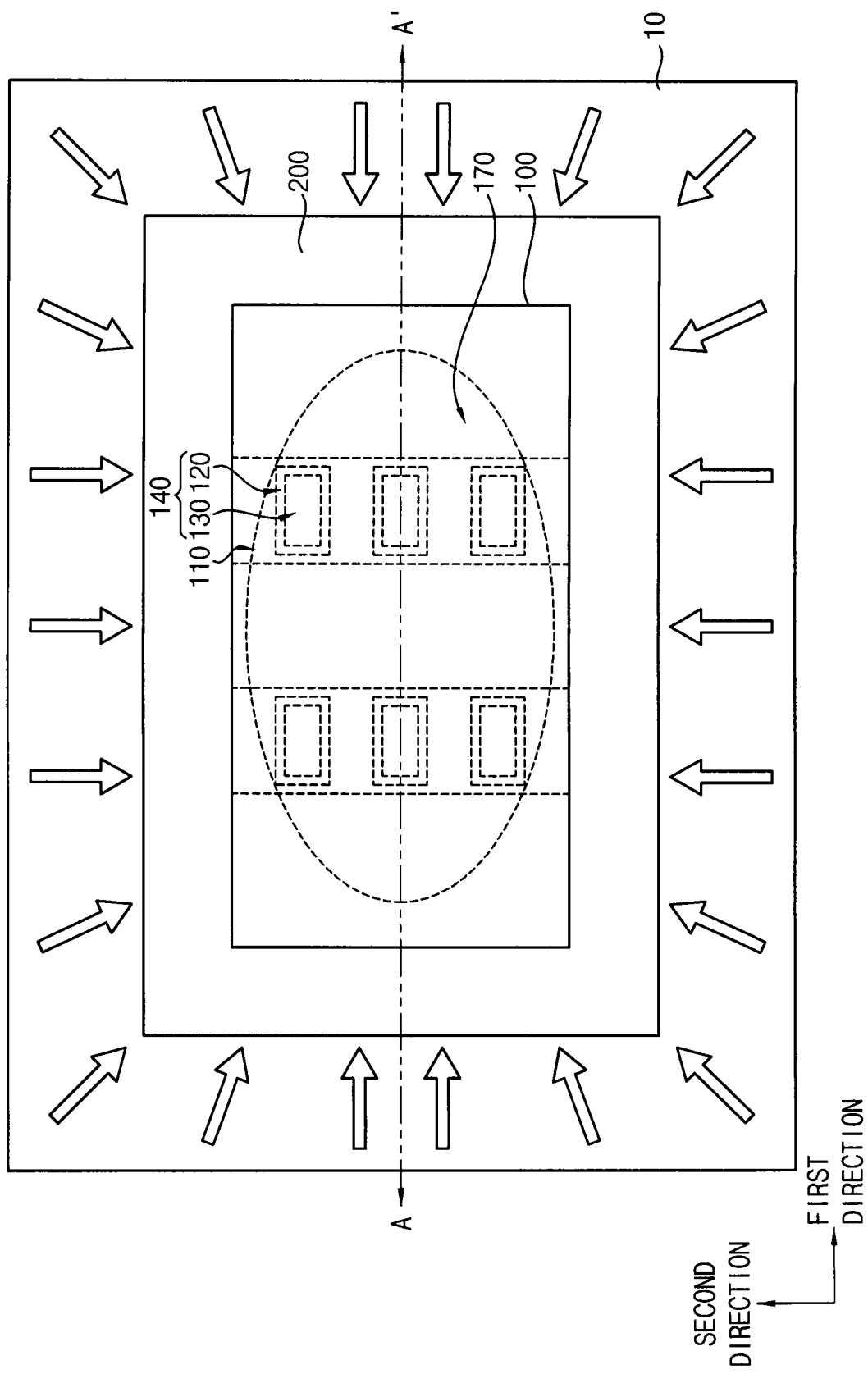
Figure 15:
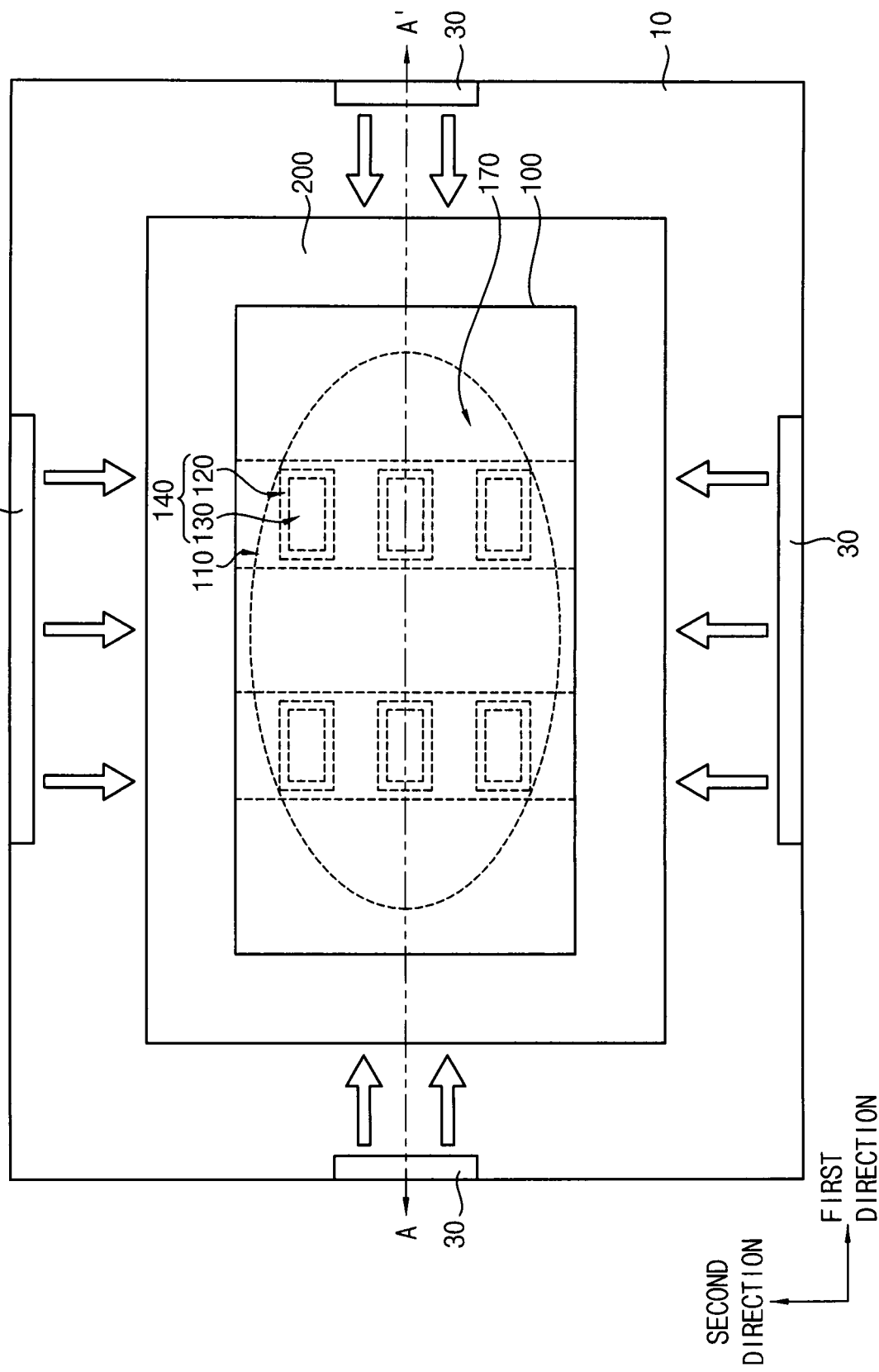
Figure 16:
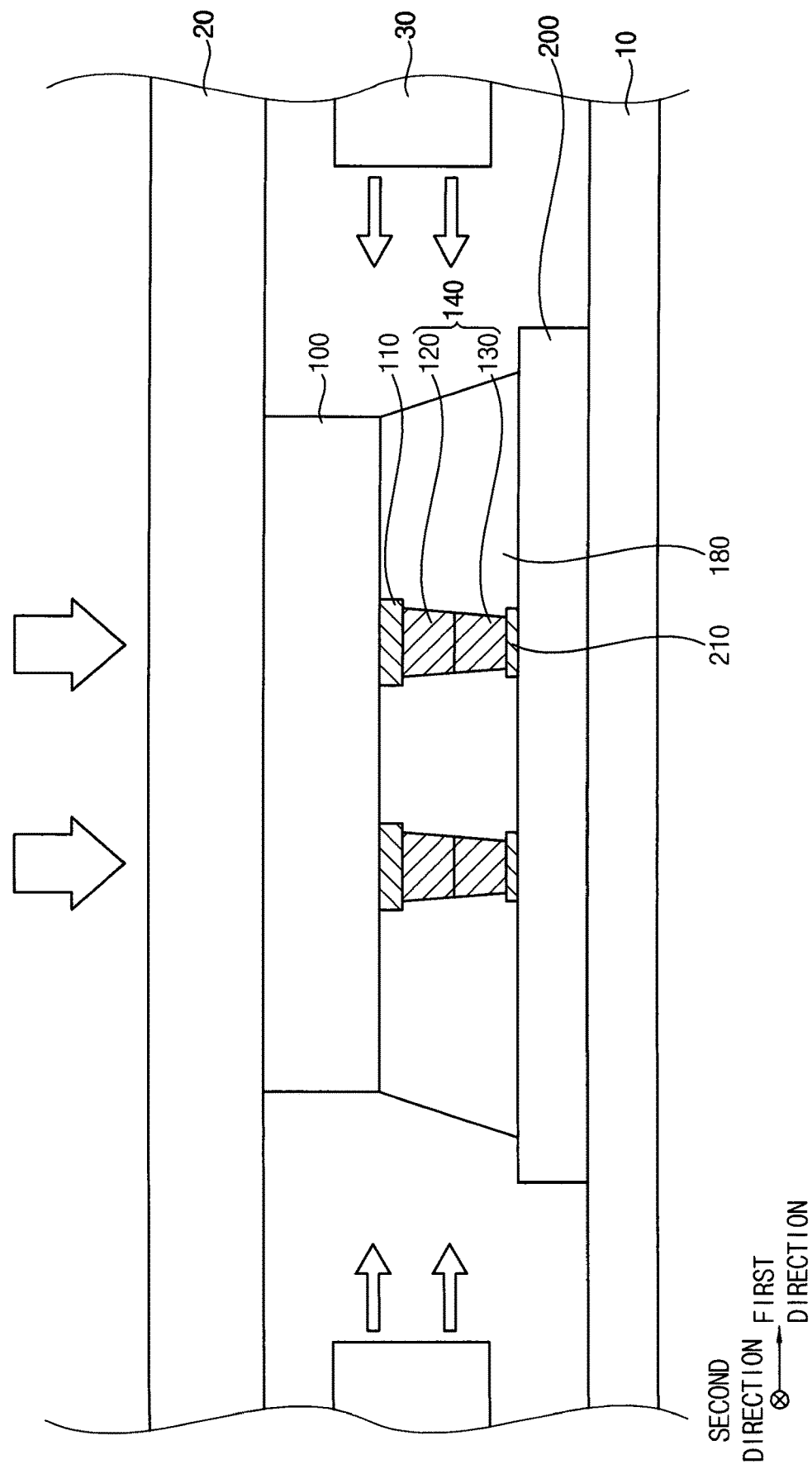
Figure 17:
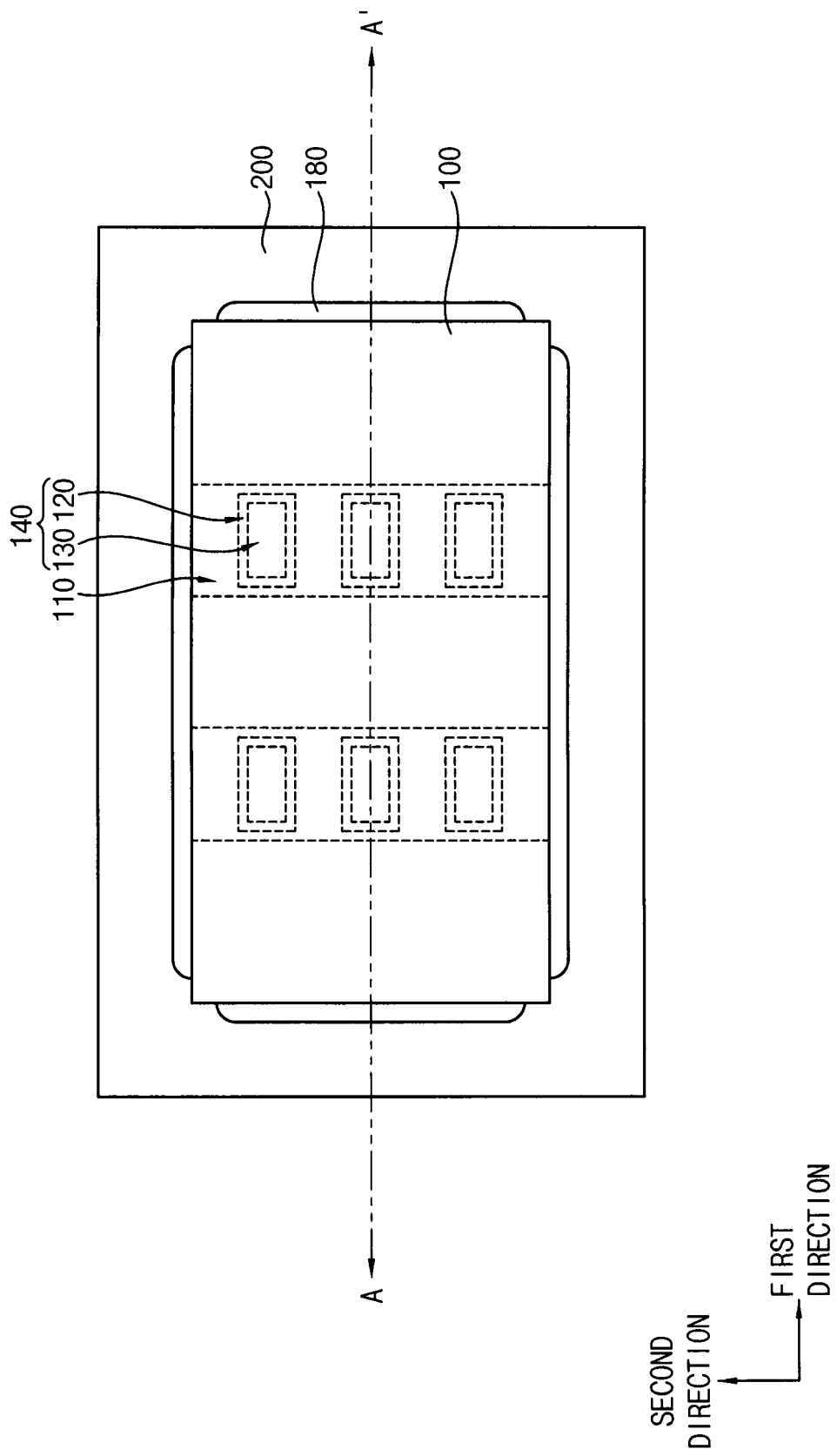

FIGS. 12 to 18 are plan views and cross-sectional views illustrating an adhesion method of semiconductor chips in accordance with example embodiments. Specifically, FIGS. 14-15 and 17-18 are the plan views and FIGS. 12-13 and 16 are cross-sectional views taken along lines A-A' of corresponding plan views, respectively.

This adhesion method of the semiconductor chips includes processes substantially the same as or similar to the adhesion method of the semiconductor chips illustrated in FIGS. 1 to 11. Accordingly, like reference numerals refer to like elements, and detailed descriptions thereon are omitted herein.

Referring to FIG. 12, an adhesive paste 170 including a thermosetting resin and a photo-curable resin may be applied on the substrate 200 including the substrate pad 210 to cover the substrate pad 210.

The adhesive paste 170 may include a material substantially the same as the adhesive film 150, however, may have a liquid or paste form rather than a film form.

Referring to FIG. 13, the substrate 200 on which the adhesive paste 170 is applied may be disposed on the lower mold 10, the semiconductor chip 100 may be mounted on the adhesive paste 170, the upper mold 20 may be disposed on the semiconductor chip 100, and the ultraviolet irradiator 30 may be disposed in the space between the lower and upper molds 10 and 20.

The chip pad 110 and the first and second conductive bumps 120 and 130 included in the connection structure of the semiconductor chip 100 that may be covered by the adhesive paste 170, and the substrate pad 210 of the substrate 200 may be aligned with each other. For example, the connection structure of the semiconductor chip 100 may be aligned to overlap the substrate pad 210 of the substrate 200 in a plan view. For example, the thickness of the adhesive paste 170 formed on the substrate 200 may be greater than the thickness of the connection structure.

Referring to FIGS. 14 to 17, the thermo-compression process and the ultraviolet irradiation process may be simultaneously performed on the adhesive paste 170, the semiconductor chip 100 and the substrate 200.

Accordingly, the adhesive paste 170 disposed in the space between the semiconductor chip 100 and the substrate 200 may be compressed while heat is provided to the adhesive paste 170, so that the connection structure of the semiconductor chip 100 may contact the substrate pad 210 of the substrate 200 to be electrically connected thereto, and the adhesive paste 170 may be cured to form a second cured film 180 by the thermo-compression process and the ultraviolet irradiation process.

The thermo-compression process may be performed by downwardly moving the upper mold 20 to press the semiconductor chip 100 onto the substrate 200 disposed on the lower mold 10, and increasing the temperature of the space between the lower and upper molds 10 and 20. Specifically, heat is applied from an external source, such as by heating one or both of lower and upper molds 10 and 20, or by applying heat to the atmosphere between the lower and upper molds 10 and 20 from an external source which is then transferred to adhesive paste 170. As illustrated in FIG. 14, the thermo-compression process may be performed on a portion of the adhesive paste 170 corresponding to all sides including vertex portions of a polygonal shape of the semiconductor chip 100.

The ultraviolet irradiation process may be performed on the adhesive paste 170 by irradiating ultraviolet rays generated from the ultraviolet irradiator 30 at an angle of about 0° to about 90° with respect to the upper surface of the substrate 200. As illustrated in FIG. 15, the ultraviolet irradiation process may be performed on a portion of the adhesive paste 170 corresponding to all sides except for the vertex portions of a polygonal shape of the semiconductor chip 100, or corresponding to at least one side of the polygonal shape of the semiconductor chip 100.

In this case, the components of the second cured film 180 may be substantially the same as those of the first cured film 160.

FIG. 16 illustrates that a sidewall of the second cured film 180 that is formed by curing the adhesive paste 170 has a constant slope with respect to the upper surface of the substrate 200, however, the inventive concept is not limited thereto. For example, a sidewall of the second cured film 180 may have a non-constant slope with respect to the upper surface of the substrate 200, and for example, the second cured film 180 may have a sidewall having an increasing slope or a decreasing slope with respect to the upper surface of the substrate 200.

Referring to FIG. 18, the second cured film 180 may fill all spaces on the substrate 200 corresponding to the semiconductor chip 100, e.g., in a plan view. However, an area of the portions of the second cured film 180 outwardly protruding from the semiconductor chip 100 in a plan view may be small.

The above adhesion method of the semiconductor chips may be used for bonding semiconductor chips including semiconductor devices, e.g., logic devices or memory devices. For example, the adhesion method may be used for bonding semiconductor chips including logic devices such as central processing units (CPUs), main processing units (MPUs), or application processors (APs), or the like, volatile memory devices such as DRAM devices or SRAM devices, or the like, or non-volatile memory devices such as flash memory devices, PRAM devices, MRAM devices, RRAM devices, or the like.

As described above, although the present invention has been described with reference to example embodiments, those skilled in the art will readily appreciate that many modifications are possible in the example embodiments without materially departing from the novel teachings and advantages of the present inventive concept.

What is claimed is:

1. A method of manufacturing a semiconductor device, the method comprising:
   forming an adhesive film on a surface of a semiconductor chip;
   mounting the semiconductor chip on a substrate such that the adhesive film contacts an upper surface of the substrate; and
   bonding the semiconductor chip and the substrate by curing the adhesive film by simultaneously performing a thermo-compression process and an ultraviolet irradiation process on the adhesive film disposed between the substrate and the semiconductor chip,
   wherein the semiconductor chip has a polygonal shape in a plan view,
   wherein the ultraviolet irradiation process is performed by irradiating the adhesive film with ultraviolet light from at least one side of the polygonal shape of the semiconductor chip, and
   wherein the ultraviolet light does not irradiate the adhesive film in vicinities of vertices of the polygonal shape of the semiconductor chip.

2. The method of claim 1, wherein the ultraviolet irradiation process is performed by irradiating the adhesive film with ultraviolet light from all sides of the polygonal shape of the semiconductor chip.

3. The method of claim 1, wherein the ultraviolet irradiation process is performed at an angle of about 0° to about 90° with respect to the upper surface of the substrate.

4. The method of claim 1, wherein the ultraviolet irradiation process is performed at a light quantity of about 5,000 mJ/cm$^2$ or less.

5. The method of claim 1, wherein the thermo-compression process is performed at a temperature of about 350° C. or less and a pressure of about 100 N/mm$^2$ or less.

6. The method of claim 1, wherein the substrate is a printed circuit board (PCB), a silicon (Si) chip or a silicon (Si) wafer.

7. The method of claim 1, wherein the adhesive film is formed on the semiconductor chip by a chemical vapor deposition process or an atomic layer deposition process.

8. The method of claim 1, wherein the adhesive film is cured to form a cured film by performing the thermo-compression process and the ultraviolet irradiation process.

9. The method of claim 8, wherein a difference between a width of a lower surface of the cured film formed by curing the adhesive film and a width of a lower surface of the semiconductor chip is about 500 μm or less.

10. The method of claim 1, wherein the adhesive film includes a thermosetting resin and a photo-curable resin.

11. The method of claim 10, wherein the adhesive film further includes a binding resin, and
    wherein the binding resin includes an acrylic resin or a phenoxy resin.

12. The method of claim 10, wherein the thermosetting resin is formed by a reaction between at least one selected from a group consisting of an epoxy resin, an acrylic resin and a silicon resin, and a thermosetting agent.

13. The method of claim 12, wherein the thermosetting agent includes at least one selected from a group consisting of an amine hardener, an acid anhydride hardener, a polyol hardener, an azine hardener and a phenol hardener.

14. The method of claim 10, wherein the adhesive film further includes at least one selected from a group consisting of an inorganic filler, an organic filler and a metal filler.

15. The method of claim 14, wherein the inorganic filler includes at least one selected from a group consisting of silicon dioxide ($SiO_2$), aluminum oxide ($Al_2O_3$), titanium dioxide ($TiO_2$), aluminum nitride (AlN), silicon nitride ($Si_3N_4$) and boron nitride (BN), the organic filler includes acrylic copolymer containing epoxy group with a molecular weight of 100,000 or more, and the metal filler includes at least one selected from a group consisting of aluminum (Al), nickel (Ni) and silver (Ag).

16. The method of claim 10, wherein the photo-curable resin is formed by a reaction between an acrylic resin having carbon double bond and a photo-curing initiator.

17. The method of claim 16, wherein the acrylic resin having carbon double bond includes at least one selected from a group consisting of 2-hydroxyethyl acrylate (HEA), 2-hydroxyethyl methacrylate (HEMA), 2,3-epoxypropyl methacrylate (EPMA), acrylic acid (AA) and methacrylic acid (MAA).

18. The method of claim 16, wherein the photo-curing initiator includes at least one selected from a group consisting of isodecyl acrylate (IDA), 2-penoxyethyl acrylate (PEA), hexanediol diacrylate (HDDA), tripropylene glycol diacrylate (TrPGDA), trimethylolpropane triacrylate (TMPTA) and trimethylolpropane ethoxy triacrylate (TMPEOTA).

19. A method of manufacturing a semiconductor device, the method comprising:
    forming a connection structure on a surface of a semiconductor chip;
    forming an adhesive film on the semiconductor chip to cover the connection structure;
    mounting the semiconductor chip on a substrate such that the adhesive film contacts an upper surface of the substrate; and
    bonding the semiconductor chip and the substrate by curing the adhesive film by simultaneously performing a thermo-compression process and an ultraviolet irradiation process on the adhesive film positioned between the substrate and the semiconductor chip, wherein the semiconductor chip has a polygonal shape in a plan view, wherein the ultraviolet irradiation process is performed by irradiating the adhesive film with ultraviolet light from at least one side of the polygonal shape of the semiconductor chip, and wherein the ultraviolet light does not irradiate the adhesive film in vicinities of vertices of the polygonal shape of the semiconductor chip.

20. A method of manufacturing a semiconductor device, the method comprising:

applying an adhesive paste on a substrate including a pad;

mounting a semiconductor chip on the substrate on which the adhesive paste is applied; and bonding the semiconductor chip and the substrate by curing the adhesive paste by simultaneously performing a thermo-compression process and an ultraviolet irradiation process on the adhesive paste disposed between the substrate and the semiconductor chip, wherein the semiconductor chip has a polygonal shape in a plan view, wherein the ultraviolet irradiation process is performed by irradiating the adhesive paste with ultraviolet light from at least one side of the polygonal shape of the semiconductor chip, and wherein the ultraviolet light does not irradiate the adhesive paste in vicinities of vertices of the polygonal shape of the semiconductor chip.

* * * * *